United States Patent [19]

Broers

[11] 4,210,806

[45] Jul. 1, 1980

[54] HIGH BRIGHTNESS ELECTRON PROBE BEAM AND METHOD

[75] Inventor: Alec N. Broers, Purdys Station, N.Y.

[73] Assignee: International Business Machines Corporation, Armonk, N.Y.

[21] Appl. No.: 4,518

[22] Filed: Jan. 18, 1979

[51] Int. Cl.² ............................................ G01M 23/00
[52] U.S. Cl. .................................. 250/311; 250/397; 250/492 R
[58] Field of Search ........... 250/311, 396, 397, 492 A, 250/492 R

[56] References Cited

U.S. PATENT DOCUMENTS

| | | |
|---|---|---|
| 2,494,442 | 1/1950 | Le Poole .............................. 250/311 |
| 3,283,120 | 11/1966 | Spruck .................................. 250/311 |
| 3,491,236 | 1/1970 | Newberry ........................ 250/492 A |

Primary Examiner—Harold A. Dixon
Attorney, Agent, or Firm—Ronald L. Drumheller

[57] ABSTRACT

A high brightness electron probe beam is formed by generating an electron beam with an electron gun operated in a high current emission configuration, selecting the region of the cross-over having the highest brightness and then limiting contributions to the final beam of a demagnification column to electrons originating only from this region of the cross-over.

22 Claims, 8 Drawing Figures

HIGH BRIGHTNESS ELECTRON PROBE BEAM AND METHOD

DESCRIPTION

1. Technical Field

This invention relates to apparatus and a method for producing a very narrow electron beam of high brightness.

2. Background Art

Electron probe beams are used in electron beam instruments such as scanning electron microscopes, electron beam X-ray microanalysers and electron beam microcircuit fabrication systems. An electron probe beam is typically formed by an electron optical column which demagnifies the cross-over region in an electron gun, which is where the electrons emitted from the cathode cross over the axis and form a beam region of minimum cross-section. It has been recognized that high brightness is a generally desirable characteristic for an electron probe beam. Since brightness conservation is a fundamental law of optics, however, it has been uniformly assumed by the prior art that the brightness of an electron probe beam will not depend upon the design of the electron optical system. Heretofore, it has been assumed that the brightness of an electron probe beam can be increased only by increasing the brightness of the electron gun cross-over.

Electron beams have sometimes been shaped by illuminating a physical aperture which then becomes the object for the electron optical column rather than the gun cross-over. Beam shaping has been done largely in order to produce a well defined cross-sectional shape for the beam and in some instances it has been used to improve edge sharpness. No improvement in brightness has been recognized by the prior art as a result of beam shaping except for the indirect effect which an improved edge sharpness has upon an average brightness calculation.

Electron gun cross-overs have been studied and it has been recognized that both Gaussian and nonGaussian emission patterns are possible under suitable performance conditions. It has been assumed, however, that only Gaussian cross-overs are suitable for generating a practical electron probe beam. This assumption has apparently resulted partly from observations that nonGaussian profiles generally have lower average brightness even through peak brightness within the profile might be much higher and partly from the assumption that structure (uneven intensity distribution) in a cross-over results in structure in the final beam, which is undesirable.

It has been recognized by the prior art that an electron probe beam utilizes only a portion of the angular distribution of electron intensity within a cross-over so that proper orientation of the cross-over with respect to the column axis is crucial for maximum brightness. However, the prior art has not recognized that an electron probe beam need utilize electrons from only a spatial portion of the crossover as well and that improved brightness might result therefrom.

It is an object of the present invention to generate an electron probe beam having higher brightness.

Another object is to form an electron probe beam using only a portion of the cross-over.

Still another object is to form an electron probe beam from a cross-over having nonGaussian characteristics.

It is also an object to form an electron probe beam having a brightness as close as possible to the peak brightness within the cross-over of an electron gun.

According to the present invention, the brightness of an electron probe beam is not necessarily determined by the average brightness of the electron beam cross-over from which it has been formed. By suitable design of the electron optical system, the final beam may be formed from electrons contributed by only a limited and possibly small region of the cross-over and the precise region which does contribute may be controlled and selected. As a result of such mode of operation, brightness of the final beam will instead correspond more closely to the brightness of the contributing region of the cross-over, which may be selected to be the region of maximum brightness. The electron gun may now also be operated so as to maximize the brightness within a subregion of the cross-over instead of operating it so as to maximize the overall average brightness of the cross-over.

Electron optical columns which limit the region of the cross-over contributing to the final beam and which permit selection of the contributing region are characterized by having an aperture positioned in the plane of an image of the cross-over, the image being larger than the aperture so that only the portion of the image aligned with the aperture is passed therethrough and contributes to the final beam. The electron optical column images an aperture onto the target plane instead of the cross-over. The imaged aperture may be the contributing region defining aperture or a pupillary aperture depending upon the particular configuration of the electron optical system. The portion of the image passed by the region defining aperture through to the final beam may be changed by changing the position of the image of the cross-over with respect to the region defining aperture. The position of the cross-over image may be conveniently controlled through the use of a deflection yoke, which may also be used to scan the image across the aperture in order to form a display of the cross-over intensity distribution.

In general, the effective angular alignment of the cross-over with respect to the column axis still has a serious effect upon final brightness. As the beam emerging from the cross-over is effectively tilted with respect to the column axis, the effective intensity distribution of the cross-over changes. The brightest region of the cross-over at one tilt angle is not necessarily the brightest region at another tilt angle, and the brightest regions at different tilt angles generally have different brightness. Thus, in order to produce maximum brightness in the final beam, the most favorable combination of tilt angle and contributing region must be found. In addition to the position of the contributing region, the size of the contributing region could also be simultaneously varied for brightness optimization.

BRIEF DESCRIPTION OF THE DRAWINGS

The present invention will be further explained in connection with the attached drawings in which like reference characters identify corresponding structure and in which.

THEORY OF THE INVENTION

Figure 1:
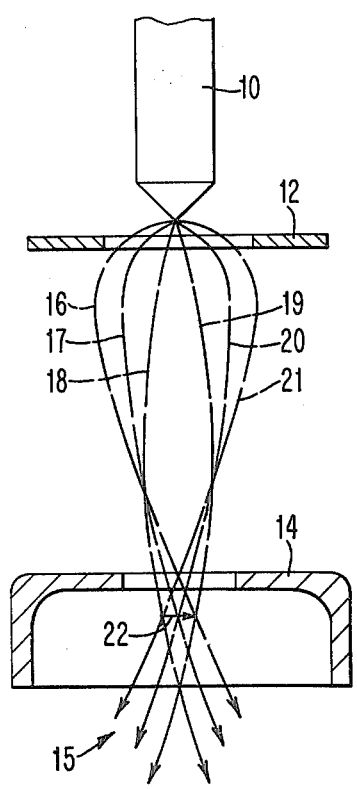
FIG. 1 is an electron gun.

FIG. 1 shows a typical thermal cathode electron gun. Cathode 10 is heated until it reaches a temperature where electrons tend to be emitted from the surface thereof. Grid 12 is held at a negative potential with respect to the cathode and positioned so as to suppress electron emission from everywhere on the cathode tip surface except from a controlled region near the apex of the tip, as shown. Cathode 10 is held at a negative potential with respect to the anode 14, which is positioned so as to accelerate emitted electrons into a diverging beam 15. Electrons travel in many different trajectories such as illustrated by the exaggerated trajectories 16-21.

Optically this diverging beam 15 appears to originate from a source position which corresponds to the location where the diverging beam (following straight trajectories backwards) has a minimum cross-sectional area or size. The electrons do not actually originate at this position because the fields within the gun have bent the electron trajectories. To the subsequent electron optical systems, however, the source of the beam is effectively at this position of apparent minimum beam size. Since it actually corresponds to approximately the position where electron trajectories are crossing over the beam axis, this apparent source will be hereinafter referred to as the "cross-over." It should be appreciated that electron trajectories do not cross the beam axis all at the same axial position, nor is it necessarily true that the diverging beam must be formed by electron trajectories which have actually crossed over the beam axis. The diverging electron beam theoretically may have a virtual rather than a real cross-over. In any event, the effective cross-over may be found by following straight paths backward from the diverging beam and determining the axial position where the paths cross each other to form a beam of minimum size. In FIG. 1, the cross-over is identified by arrow 22. The cross-over becomes the object for a subsequent electron optical column.

Figure 2:
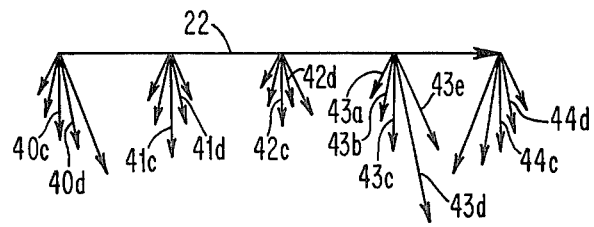
FIG. 2 is a discrete representation of the angular and spatial electron intensity distribution of an electron gun cross-over.

The cross-over may have many different shapes depending upon the electron gun configuration and operating conditions. The density of electrons passing through (effectively originating from) a particular position in the cross-over generally varies from position to position. In addition, the angular distribution of electrons originating from (actually passing through) a particular position in the cross-over also generally varies from position to position though not necessarily very much. This situation is illustrated in FIG. 2 where the arrows from each of five discrete positions in the cross-over 22 represent by their directions five possible discrete directions of electron travel from each position and by their length the electron beam intensity in each of the five directions. It should be recognized that a real cross-over has electrons passing through essentially every point in the cross-over rather than through discrete points and the angular distribution through each point is also continuous rather than discrete.

Figure 3:
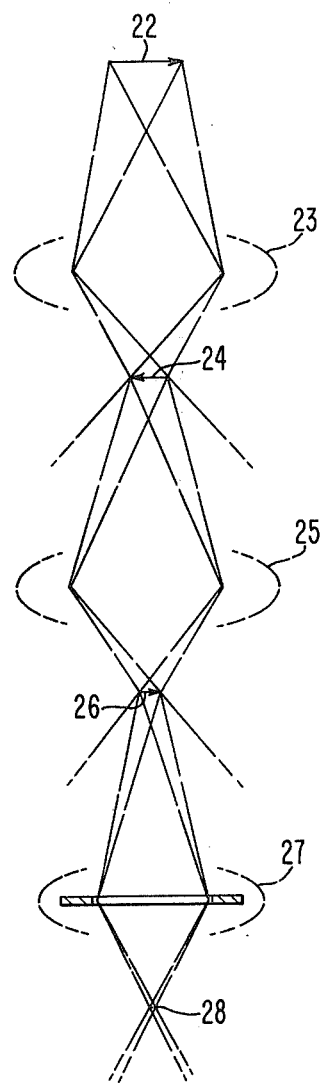
FIG. 3 is a prior art electron optical column.

FIG. 3 shows a typical prior art electron optical column used with an electron beam cross-over for producing an electron probe beam. Magnetic lens 23 demagnifies cross-over 22 by typically between 20 and 100 times and images it to a new position as image 24. Magnetic lens 25 demagnifies image 24 again by typically between 20 and 100 times and images it to still another position as image 26. Magnetic lens 27 demagnifies image 26 once again by typically 20 to 100 times and images it onto the target plane as image 28.

Figure 4:
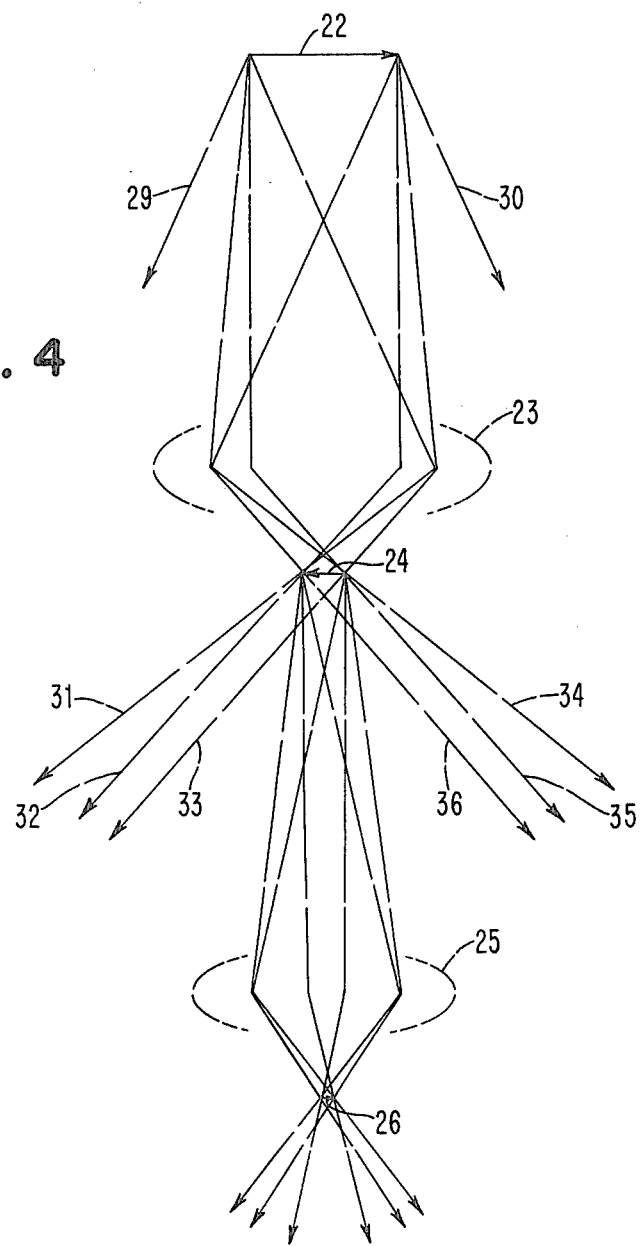
FIG. 4 is an enlarged representation of electron beam demagnification.

It should be apparent that each of the magnetic lenses in FIG. 3 collects only a fraction of the angular distribution of electrons available at its object plane. This is illustrated in FIG. 4. Not all of the diverging electron beam directions from cross-over 22 are collected by lens 23. For example, electron directions 29, 30 do not enter lens 23. Of those electron directions which do enter lens 23, many are not collected by lens 25, such as directions 31-36. In reality, the large demagnification that the electron beam undergoes results in the electron optical system effectively selecting an electron direction and passing through to the final beam only electrons which were travelling very close to the selected direction at the cross-over. Referring to FIG. 2, this means, for example, that if the selected direction is the vertical direction, then the electrons corresponding to arrows $40c$, $41c$, $42c$, $43c$ and $44c$ would be passed on to the final beam and the electrons corresponding to the remaining arrows would be lost.

Figure 5:
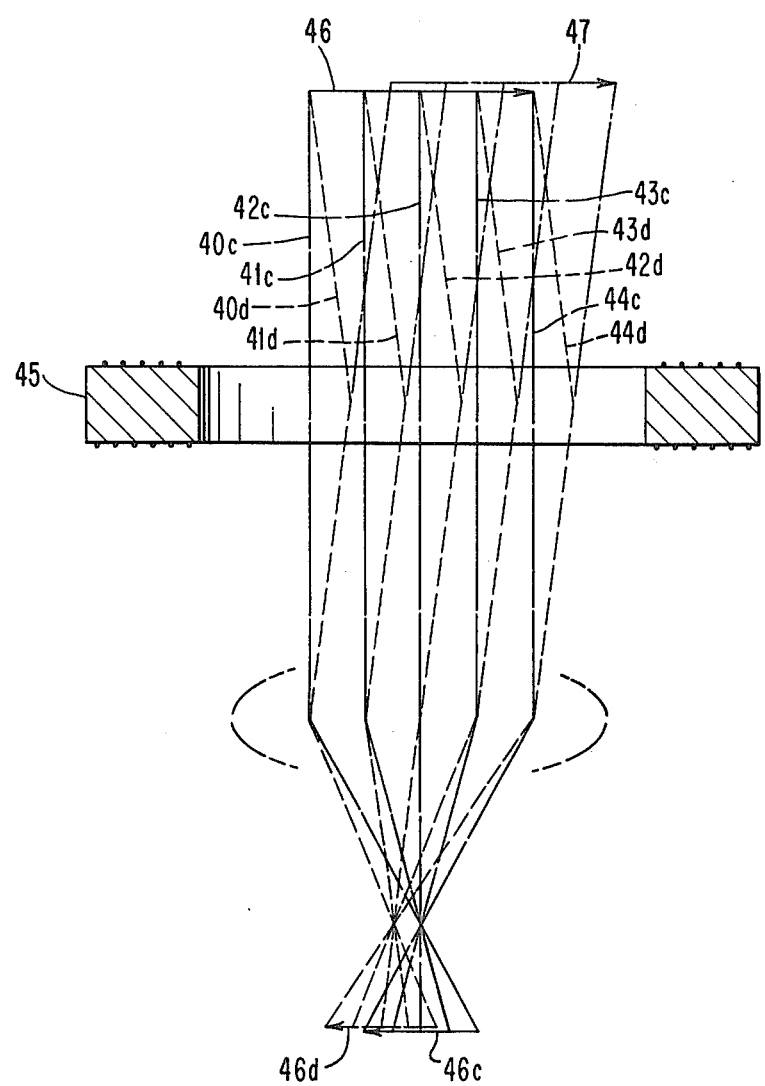
FIG. 5 illustrates the effect of a beam deflection.

FIG. 5 shows what happens when a deflection yoke exerts a force on the electron beam. With no deflection, object 46 produces image $46c$ using the electrons which correspond to directions $40c$, $41c$, $42c$, $43c$ and $44c$, as shown. Upon deflection, however, a different set of electron directions is selected to form the image. In FIG. 5 a new image $46d$ is now formed using the electrons which correspond to directions $40d$, $41d$, $42d$, $43d$ and $44d$, as shown. It is appreciated that with the scale shown in FIG. 5 and the large angles illustrated in FIG. 5, it would appear that lens 45 might collect a larger range of angular directions. In practice, the scale and the angles involved result in the lens effectively collecting electrons only from a very small range of directions, but deflection of the beam can change the position of the range by a very great amount. What occurs in effect is what is shown in FIG. 5.

Image $46d$ is displaced in position with respect to image $46c$, which corresponds effectively to a different object position 47 when there is no beam deflection. The lateral movement of the image ordinarily causes no problem with the final position of the beam because the probe beam will in general be scanning about on the target plane anyway by a much larger amount. Thus, a slight shift in the nominal position of the final probe beam does not affect the system. The cross-over itself can be physically translated or tilted with respect to the electron optical column with the same effect of changing the electron emission direction of the cross-over which is selected by the column for passage through to the final beam. Varying the selected emission angle does in general affect the brightness of the final beam. With respect to FIG. 2, the electrons which contribute to the final beam in each of the five discretely represented emission directions are represented by the sum of the five arrows pointing in each of the directions. For example, in the vertical emission direction, the electrons contributing to the final beam are the sum of $40c$, $41c$, $42c$, $43c$ and $44c$, while the electrons contributing to the final beam when the "d" direction is selected would be $40d$, $41d$, $42d$, $43d$ and $44d$. These two sums are different and correspond to the different brightness which results from effectively tilting the cross-over.

Brightness may be maximized in the conventional system without changing the cross-over characteristics by causing an actual or effective shift or tilt of the beam. The brightness of the final beam may also be changed by changing the characteristics of the cross-over. Different electron gun configurations and even different materials for the cathode all change the cross-over characteristics. Prior art work in increasing the brightness of the final beam has centered upon the electron gun and the techniques and materials for creating a bright cross-over. This invention is directed instead towards the problem of achieving maximum brightness in the final beam without changing the cross-over characteristics. It has always been assumed that when the best emission angle is found, then brightness cannot be further increased without changing characteristics of the cross-over. This apparently follows from basic optical considerations and from the definition of brightness. The brightness of a beam is proportional to the electron current density in the beam but it is also inversely proportional to the square of the beam convergence half-angle. When the beam is demagnified by a factor of 20, the cross-sectional area of the imaged beam decreases by a factor of 400 and therefore the average current density goes up by a factor of 400. However, the demagnification also increases the convergence half-angle by a factor of 20. Therefore, brightness does not change. When the convergence half-angle is reduced by a stop, the electrons which have been blocked by the stop reduce the current density by the square of the angle reduction so that brightness does not change once again. These considerations have led to the conclusion that brightness increases can only be made by changing the cross-over characteristics or the effective angle or position thereof with respect to the column axis.

When a thermal cathode is not immersed too deeply into the accelerating field of the anode, the cross-over tends to be round in shape and the intensity distribution in both position and angle is essentially Gaussian. When the cathode is deeply immersed into the accelerating field, the situation is quite different. The electron density within the beam becomes very nonuniform and the angular distributions also change and vary much more from position to position within the cross-over. Down at the target plane, the beam becomes nonuniform, which is generally undesirable. As a result, the gun is normally operated so as to keep the cross-over Gaussian in character.

The current invention recognizes that it is not necessary to have the entire cross-over contributing to the final beam and that as a result of accepting for the final beam only electrons from a properly selected small region of the cross-over. The brightness of the final beam may be increased.

Referring to FIG. 2, this is equivalent to accepting electrons from only one discrete position, say the "d" position. The dimension of the object for the electron optical column has thus been reduced by a factor of five. If the final spot size is not changed, then the demagnification must be five times less. This results in an acceptance angle which has been increased correspondingly by five times. In FIG. 2, this corresponds now to accepting electrons from directions 43a, 43b, 43c, 43d, and 43e. In reality the accepted angle of a conventional system is so small that an angle five times or even fifty times larger is still a small angle in absolute terms. It might be better therefore to compare the sum of one-fifth of each of the arrows 40d, 41d, 42d, 43d and 44d and compare to the entire arrow 43d. It can readily be seen that if the selected position and direction have higher than average current density, the brightness of the final beam will be increased. It also now becomes practical to operate the electron gun in a high current emission mode where the cross-over becomes nonuniform. As a result of such operation, some of the angle/position combinations can be expected to have much higher current densities than others. This has been observed in practice.

Fundamental to this new approach is a redesigned electron optical column which permits the emission angle which is accepted to be controlled as well as the contributing region of the cross-over. These two variables cannot in practice be entirely independent of each other, but a well designed electron optical column can provide for selection of each substantially independently of the other.

BEST MODE FOR CARRYING OUT THE INVENTION

Figure 6:
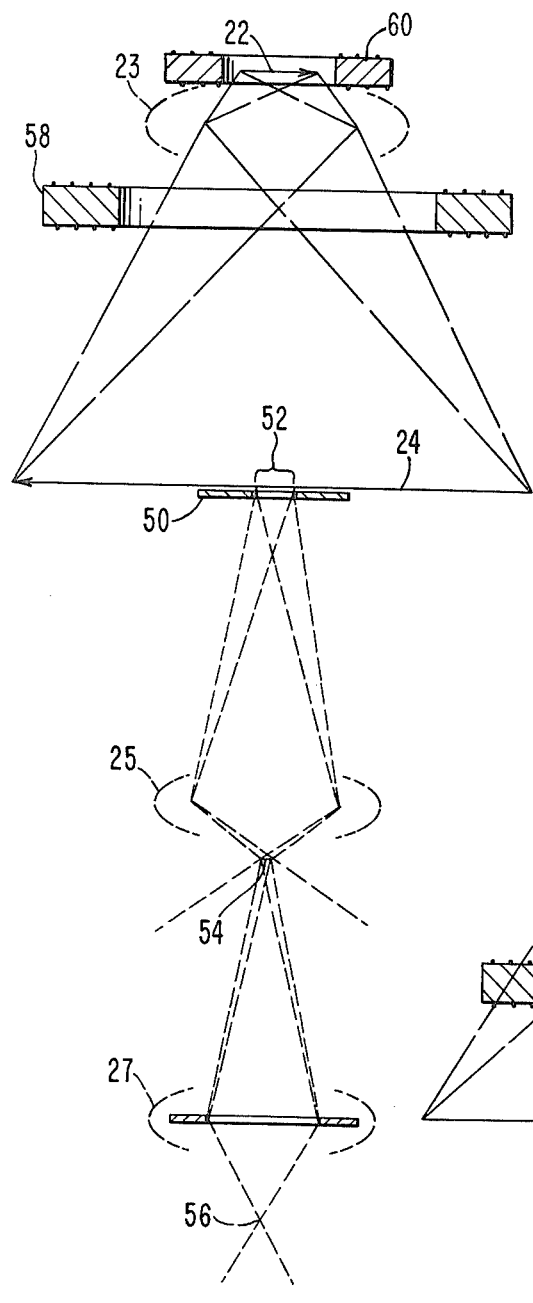
FIG. 6 is an electron optical column designed in accordance with the principles of the present invention.
Figure 7:
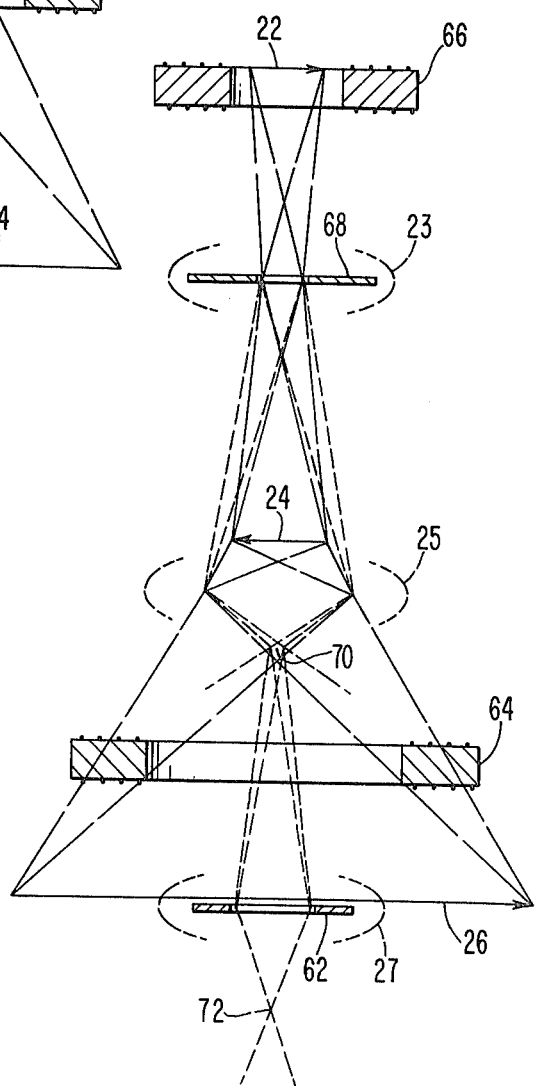
FIG. 7 is another electron optical column designed in accordance with the present invention.

FIGS. 6 and 7 illustrate electron optical columns which satisfy the requirements of the present invention. In FIG. 6 the cross-over 22 is imaged by magnetic lens 23 into an image 24, which is adjacent to or in the plane of an aperture 50. The size of the opening in aperture 50 is smaller than image 24. This aperture limits the region of the cross-over which will contribute to the final beam to that portion of the corresponding image 24 that passes through aperture 50. If the aperture opening is small with respect to the image 24, then the selected region of the cross-over will be correspondingly small. It is not necessary that image 24 be larger than the cross-over (magnification) if the aperture 24 can be fabricated with an opening which is suitably small. It is alternatively possible in some cases to place the subregion defining aperture 50 in or closely adjacent to the plane of the cross-over 22 instead of in the plane of or adjacent to an image thereof. It should also be clear that the aperture 50 could also be placed farther down the column in the plane of or adjacent to a later image of the cross-over.

A portion 52 of the image 24 is imaged by lens 25 into image 54 and the imaged portion of the cross-over is finally imaged onto the target plane as a further reduced image 56 of that portion. The spatial portion of the cross-over which contributes to the final beam is varied by deflecting the beam at any point above the aperture 50 except at the cross-over or at any image of the cross-over. Deflection yoke 58 is used for this purpose. In order to change the portion of the angular distribution which contributes to the final beam, the beam is again deflected but this time the deflection is suitably close to or at the cross-over or at an image thereof. Deflection yoke 60 is used for this purpose. Deflection yoke 60 preferably should be as close as possible to the cross-over so that it affects the position of the image 24 as little as possible. Deflection yoke 58 preferably should be spaced away from the cross-over for the opposite reason and must also be a working distance from the aperture 50. Ideally, deflection yoke 58 should be in the center of lens 23, but this is not practical. The closer deflection yoke 58 is to the lens 23, the less it would seem to affect angular selection.

It is also possible to vary the emission angle which will be selected by the electron optical column with a deflection yoke located farther down the column either at or after the emission field selecting aperture 50. In general, the farther down the column that an emission angle selection yoke is positioned, the less it can affect the angle selected. If it is positioned at an aperture, such as aperture 50, the angle selecting yoke does not affect the position of the final beam. An emission angle selecting yoke located below the field selecting aperture aperture 50 may be used for fine selection of the emission angle. A deflection yoke located at a position below the spatial field selecting aperture obviously does not affect selection of the spatial field.

FIG. 7 shows another type of column design. In this embodiment, the cross-over 22 is imaged in front of lens 25. The image 24 of the cross-over is then imaged by lens 25 into the plane of a final aperture stop 62. The spatial portion of the cross-over which is accepted by the column for the final beam is varied by deflecting the beam anywhere along the column and above stop 62 except very close to an aperture, such as either aperture 68 or aperture 62. A deflection yoke positioned at an aperture affects only the selection of an emission angle. Deflection yoke 64 may be used for the purpose of selecting the portion of the cross-over spatial distribution contributing to the final beam. Yoke 64 may be located farther above stop 62 and even above lens 23 but not too close to aperture 68 as already explained. By locating the emission region selecting yoke 64 as far as possible from any aperture (such as at the center of lens 25), it affects emission angle selection as little as possible. Emission angle selection may be accomplished as in the previous embodiment by actually translating or tilting the cross-over or by deflecting the beam with yoke 66 located suitable close to the cross-over. As a practical matter, the selected angle may be varied conveniently by physically moving the anode position within the gun. This actually displaces the cross-over very slightly, but the dominant effect is upon the direction at which the beam emerges from the gun. The effect is very similar to deflecting the beam at the cross-over.

Aperture 68, located preferably close to the center of magnetic lens 23, is imaged by lens 23 to a position 70 which is in turn imaged by lens 27 onto the target plane. The image 72 on the target plane is thus an image of the aperture 68 instead of being an image of the cross-over (conventional mode) or an image of a portion of the cross-over source (FIG. 6 embodiment). This means that there is a uniform distribution of electron intensity and an even brightness over the probe beam spot at the target plane without regard to the size of the region of the cross-over which has been selected by aperture 62 to contribute to the final beam and without regard to variations in brightness over the selected region of the cross-over, assuming the accepted range of emission angles is sufficiently small that there is no variation in brightness over the angle accepted. The column shown in FIG. 6 eliminates variations in brightness within the range of emission angles accepted but does not remove any variations in brightness within the spatial region accepted, while the column shown in FIG. 7 eliminates variations in brightness within the spatial region accepted but does not remove variations in brightness within the range of emission angles selected. However, in both cases space charge effects tend to blur such variations by the time they reach the target plane, particularly at higher current densities.

Industrial Applicability

Figure 8:
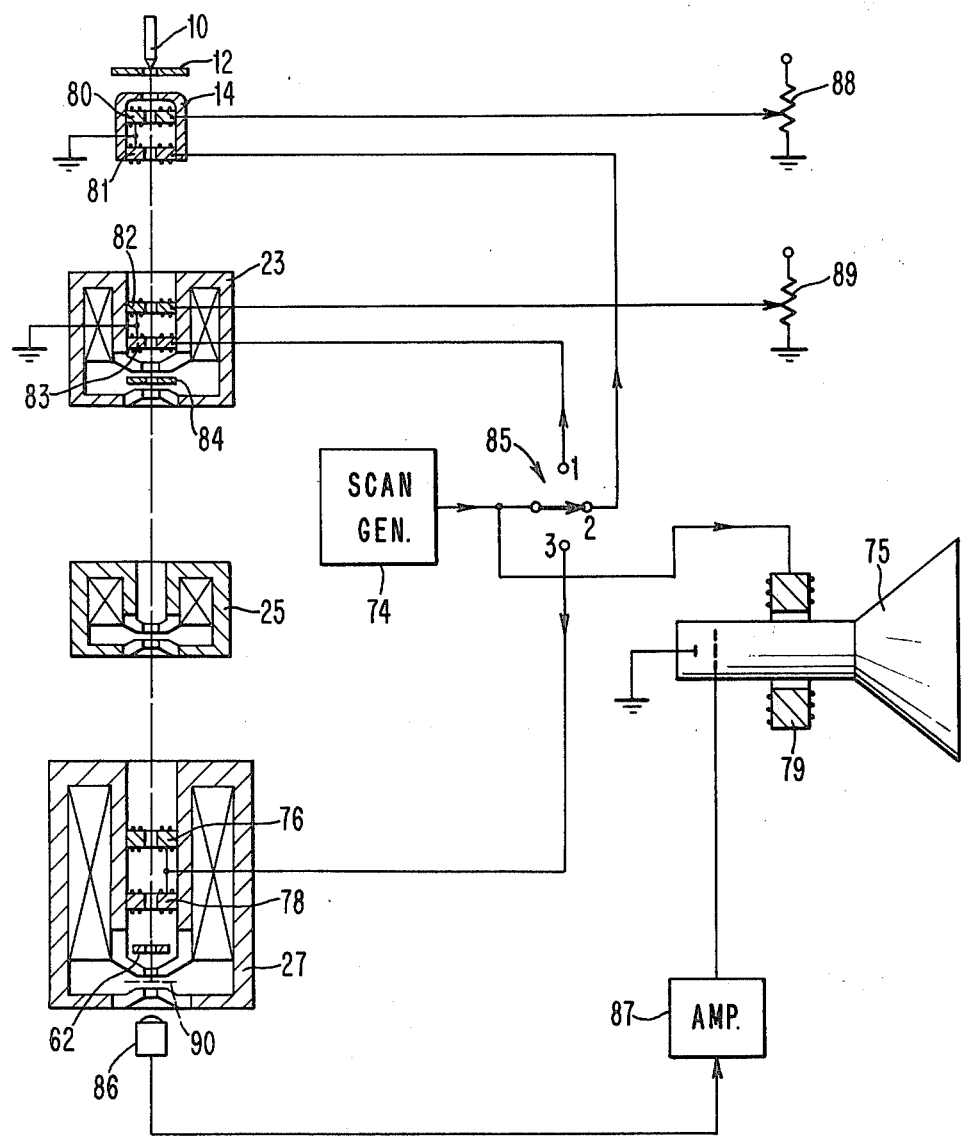
FIG. 8 is a complete system for generating an electron probe beam in accordance with this invention.

FIG. 8 applies the present invention to a state-of-the-art scanning electron microscope. The scan generator 74 and the CRT 75 which are ordinarily used with double deflection yokes 76, 78 and CRT deflection yoke 79 during operation of the microscope may be employed during a beam adjustment mode for the purpose of finding a suitable cross-over subregion and a suitable emission angle. Deflection yokes 80, 81, 82 and 83 as well as aperture 84 have been added to the existing SEM system. In order to convert to the mode of operation of the present invention, magnetic lens 23 is reduced in power until an image of the cross-over coincides with the position of the final stopping aperture 62. Aperture 62 accepts for the final beam only a portion of the spatial distribution of the cross-over, while aperture 84 accepts for the final beam only a portion of the angular distribution of the cross-over. The column in FIG. 8 is essentially identical with the column represented by FIG. 7.

Switch 85 is then brought to the 1 position so that scan generator 74 drives yoke 83, which in turn varies the portion of the spatial distribution accepted by the column for the final beam in scanning fashion. The accepted portion of the spatial distribution may be slowly varied instead by varying potentiometer 89, which in turn drives yoke 82. Electron detector 86 measures the intensity of the final beam passed by aperture 62 and via amplifier 87 drives the grid of the CRT. When the cross-over is imaged on aperture 62, a clear picture of the cross-over spatial intensity distribution at a particular emission angle (or actually small range of angles) will appear in focus on the CRT screen.

The portion of the angular distribution accepted by the electron optical system for the final beam may be slowly varied with potentiometer 88, which drives deflection yoke 80. As the selected emission angle to slowly changed, the spatial intensity distribution may be viewed on the CRT screen until an emission angle is found which produces an intense emission spot somewhere within the spatial pattern displayed. The column is caused to accept this portion of the angular distribution for the final beam during other modes of operation by keeping the potentiometer 88 at this determined setting. Then potentiometer 89 is varied until it causes deflection yoke 82 to center the intense spot on the screen. The center of the screen may be determined by removing the scan generator drive from yoke 83. The column is caused to accept this portion of the spatial distribution by keeping potentiometer 89 at this setting.

This procedure may be done with lens 27 either turned on or off and with no target at the target plane. In order to use the SEM, the power of lens 27 is increased until aperture 84 is imaged on the target plane 90. The beam then has a minimum size at the target plane and the scan generator may be switched back to deflection yokes 76, 78 for SEM mode operation.

It is alternatively possible to vary the portion of the angular distribution accepted by the column for the final beam by moving switch 85 to position 2, so that the scan generator drives deflection yoke 81. In this mode of operation, potentiometer 89 and yoke 82 may be used to slowly vary the accepted portion of the spatial distribution until the angular distribution now displayed on CRT 75 develops an intense spot somewhere within the displayed angular distribution. The column is caused to accept the determined portion of the spatial distribution by keeping potentiometer 89 at this setting. Potentiometer 88 is then varied until the intense spot within the angular distribution falls in the center of the CRT screen. The center can be determined by removing the scan drive to yoke 81. When the intense spot is centered (or otherwise corresponds to the position when there is no scanning of the beam), then the scanning via yoke 81 is terminated while keeping potentiometer 88 at this setting.

It should be readily apparent that it is not necessary to have separate yokes 82,83 in order to both scan the accepted portion of the spatial distribution and to cause the column to accept a determined portion of the spatial distribution. A single yoke may be used for both functions with suitably modified circuitry. Similarly, it is not necessary to have separate yokes 80,81 in order to both scan the accepted portion of the angular distribution and to cause the column to accept a determined portion of the angular distribution. A single yoke may be used for both of these functions. It is furthermore not necessary to have separate deflection apparatus for the angular acceptance functions and the spatial acceptance functions. It is possible, for example, to have two spaced yokes, each acting to affect both angular acceptance and spatial acceptance but electronically controlled together in a fashion such that the net effect is solely upon either angular acceptance or spatial acceptance.

A suitable selection of emission angle and cross-over subregion may be accomplished simultaneously as well as by successive approximation and the method and apparatus is readily adaptable to computerization.

Having thus described my invention, what I claim as new and desire to secure by Letters Patent is:

1. Apparatus for generating a high brightness electron beam, comprising:
    an electron gun for producing a beam of electrons having a spatial distribution of electron intensity and an angular distribution of electron intensity;
    an electron optical column for demagnifying said beam into a final beam focused upon a target plane, said column accepting for said final beam only a portion of said angular distribution and only a portion of said spatial distribution;
    means for varying the portion of said angular distribution accepted by said column for said final beam;
    means for varying the portion of said spatial distribution accepted by said column for said final beam;
    means for measuring the intensity of said final beam while varying the accepted portion of said angular distribution and the accepted portion of said spatial distribution in order to determine the portion of said angular distribution and the portion of said spatial distribution which together result in maximum final beam intensity; and
    means for causing said column to accept for said final beam the determined portion of said angular distribution and the determined portion of said spatial distribution, thereby maximizing the effective brightness of said final beam.

2. Apparatus as defined in claim 1 wherein said spatial distribution is not Gaussian.

3. Apparatus as defined in claim 1 wherein said means for measuring comprises an electron detector.

4. Apparatus as defined in claim 1 wherein said beam of electrons formed by said gun diverges and defines an effective cross-over, said cross-over having said spatial distribution of electron intensity and said angular distribution of electron intensity.

5. Apparatus as defined in claim 4 wherein said electron optical column comprises a first aperture coinciding substantially with an image of said cross-over and being smaller than said image in order to thereby cause said column to accept for said final beam only a portion of said spatial distribution of electron intensity of said cross-over.

6. Apparatus as defined in claim 5 wherein said means for varying the accepted portion of said spatial distribution comprises means for deflecting said beam at a position between said cross-over and said first aperture.

7. Apparatus as defined in claim 6 wherein said electron optical column comprises a magnetic lens located between said cross-over and said first aperture and said means for deflecting said beam comprises a deflection yoke positioned effectively close to said lens.

8. Apparatus as defined in claim 4 wherein said means for varying the portion of said angular distribution accepted by said column for said final beam comprises means for effectively translating said cross-over in a radial direction with respect to the optical axis of said column.

9. Apparatus as defined in claim 4 wherein said means for varying the portion of said angular distribution accepted by said column for said final beam comprises means for effectively tilting said cross-over with respect to the optical axis of said column.

10. Apparatus as defined in claim 4 wherein said means for varying the portion of said angular distribution accepted by said column for said final beam comprises means for physically moving the anode of said electron gun in a radial direction with respect to the axis of said gun.

11. Apparatus as defined in claim 4 wherein said means for varying the portion of said angular distribution accepted by said column for said final beam comprises a deflection yoke located close to said cross-over.

12. Apparatus as defined in claim 4 wherein said means for varying the portion of said spatial distribution accepted by said column for said final beam and said means for varying the portion of said angular distribution accepted by said column for said final beam comprise two deflection yokes suitably positioned at different locations along said column.

13. Apparatus as defined in claim 5 wherein said electron optical column images said first aperture upon said target plane.

14. Apparatus as defined in claim 5 wherein said electron optical column comprises at least two magnetic lenses and said first aperture is effectively at the center of one of said lenses.

15. Apparatus as defined in claim 14 wherein said first aperture is effectively at the center of the final lens of said electron optical column.

16. Apparatus as defined in claim 5 wherein said electron optical column further comprises at least two magnetic lenses and a second aperture, said second aperture being effectively at the center of one of said lenses and causing said column to accept for said final beam only a portion of said angular distribution of electron intensity of said cross-section.

17. Apparatus as defined in claim 16 wherein said second aperture effectively is at the center of the final lens of said electron optical column.

18. Apparatus as defined in claim 16 wherein said second aperture is effectively at the center of the first lens of said electron optical column.

19. Apparatus as defined in claim 18 wherein said first aperture is effectively at the center of the final lens of said electron optical column.

20. Method of producing from an initial electron beam having a cross-over with a spatial distribution of electron intensity and an angular distribution of electron intensity, a final electron beam of higher brightness than the initial electron beam, comprising the steps of:
   accepting for a final beam only a portion of said spatial distribution;
   accepting for said final beam also only a portion of said angular distribution; and
   varying the accepted portion of the spatial distribution and the accepted portion of the angular distribution until said final beam reaches maximum intensity, said final beam thereby having higher brightness than said initial beam.

21. Method of producing a high brightness electron probe beam, comprising the steps of:
   generating na intial electron beam by operating an electron gun under high current emission conditions, so as to produce a cross-over having a nonuniform spatial distribution of electron intensity;
   demagnifying the initial electron beam into a final beam;
   accepting for the final beam only electrons coming from a portion of the spatial distribution of the cross-over; and
   adjusting the accepted portion of the spatial distribution until the final beam reaches maximum intensity.

22. The method of claim 21 in which the cross-over of the initial electron beam also has an an angular distribution of electron intensity, and further comprising the steps of:
   accepting for the final beam only electrons coming from a portion of the angular distribution; and
   adjusting the accepted portion of the angular distribution until the final beam reaches maximum intensity.

* * * * *

UNITED STATES PATENT AND TRADEMARK OFFICE
CERTIFICATE OF CORRECTION

PATENT NO. : 4,210,806
DATED : July 1, 1980
INVENTOR(S) : Alec N. Broers

It is certified that error appears in the above-identified patent and that said Letters Patent are hereby corrected as shown below:

Column 11, line 20, "na intial" should read --an initial--.

Signed and Sealed this

Third Day of March 1981

[SEAL]

Attest:

RENE D. TEGTMEYER

Attesting Officer

Acting Commissioner of Patents and Trademarks